(12) United States Patent
Lee (10) Patent No.: US 8,549,387 B2
(45) Date of Patent: Oct. 1, 2013

(54) SYSTEM AND METHOD OF DECODING LDPC CODE BLOCKS

(75) Inventor: Sheng-Lung Lee, Tainan (TW)

(73) Assignee: Himax Media Solutions, Inc., Tainan County (TW)

( * ) Notice: Subject to any disclaimer, the term of this patent is extended or adjusted under 35 U.S.C. 154(b) by 443 days.

(21) Appl. No.: 12/939,638

(22) Filed: Nov. 4, 2010

(65) Prior Publication Data

US 2012/0117439 A1   May 10, 2012

(51) Int. Cl.
*H03M 13/03*   (2006.01)

(52) U.S. Cl.
USPC .................. 714/794; 714/752; 714/786

(58) Field of Classification Search
USPC .......................................... 714/752, 786, 794
See application file for complete search history.

(56) References Cited

U.S. PATENT DOCUMENTS

| | | | | |
|---|---|---|---|---|
| 7,971,127 | B2* | 6/2011 | Chin et al. | 714/780 |
| 2003/0123563 | A1* | 7/2003 | Lu | 375/265 |
| 2004/0128696 | A1* | 7/2004 | Bhaskaran et al. | 725/111 |
| 2006/0168500 | A1* | 7/2006 | Whinnett et al. | 714/794 |
| 2007/0113149 | A1* | 5/2007 | Krafft et al. | 714/760 |
| 2010/0042906 | A1* | 2/2010 | Gunnam et al. | 714/780 |
| 2011/0087933 | A1* | 4/2011 | Varnica et al. | 714/704 |
| 2011/0320902 | A1* | 12/2011 | Gunnam | 714/752 |
| 2012/0079341 | A1* | 3/2012 | Wajcer et al. | 714/752 |
| 2012/0117439 | A1* | 5/2012 | Lee | 714/752 |

FOREIGN PATENT DOCUMENTS

| | | |
|---|---|---|
| CN | 101615913 A | 12/2009 |
| CN | 101807929 A | 8/2010 |

* cited by examiner

*Primary Examiner* — Joshua Lohn
(74) *Attorney, Agent, or Firm* — Baker & McKenzie LLP (57) ABSTRACT

A receiver apparatus comprises a LDPC decoder that can apply an accelerated belief propagation method for iteratively decoding each code block. When the number of iterations reaches a certain threshold value, the accelerated belief propagation method can adjust the initial condition used in each iteration. The initial condition is adjusted so as to enhance the likelihood of convergence in the iterative method. As a result, performance of the decoder and receiver apparatus can be improved.

16 Claims, 7 Drawing Sheets

FIG. 9

SYSTEM AND METHOD OF DECODING LDPC CODE BLOCKS

BACKGROUND

1. Field of the Invention

The present invention generally relates to forward error correction, and more particularly to systems and methods of decoding low-density parity-check (LDPC) code blocks.

2. Description of the Related Art

Transmission errors may occur when data are transmitted between a source and a receiver. To ensure that the transmitted data can be properly recovered, forward error correction (FEC) codes can be embedded in the transmitted data for permitting the receiver apparatus to detect and correct some of these errors. Low-density parity-check (LDPC) codes are a class of FEC codes that is increasingly used in transmission systems owing to its enhanced performance on additive white Gaussian noise (AWGN) channels.

LDPC codes are block codes that are defined by a parity-check matrix H having M rows and N columns, M being the number of constraints and N being the number of variables. A non-zero entry of the matrix at position (m,n) indicates that the variable n participates in the constraint m. For decoding a LDPC code block, the decoder at the receiver end usually applies an iterative method that uses as input log-likelihood ratios (LLR) representing the received bit sequence of the code block. LLR is a ratio of the probability that a bit is a zero to the probability that the bit is a one. These values can represent each bit by a real number or, more commonly, an integer in some range, e.g., [−32, 31]. The sign of the LLR indicates the likelihood that the bit is a zero or a one, and the magnitude of the LLR represents the degree of likelihood. Accordingly, a value of 31 signifies that the transmitted bit is a zero with very high probability, and a value of −32 signifies that the transmitted bit is a one with very high probability.

Data represented according to the aforementioned scale is referred to as "soft data", and each iteration usually receives a sequence of inputs corresponding to probabilities for the bit values and provides as output corrected probabilities, taking into account constraints of the code. Generally, this iterative decoding method converges as the soft data closely represents the transmitted data. After each iteration is completed, the decoder makes a "hard decision" on each bit by examining the sign of the soft data. Those bits that have a positive sign (soft value between 0 and 31, for example) are assigned binary zero, and the remaining bits are assigned binary one.

Practically, it can be observed that the aforementioned decoding method may not converge properly for certain cases of high signal-to-noise ratio (SNR) channels. Such failure may be caused by the error distribution in the received bit sequence. As a result, the decoding process may inefficiently perform an excessive amount of iterations.

Therefore, there is presently a need for a system and method that can address the foregoing issues and decode LDPC code blocks in a more efficient manner.

SUMMARY

The present application describes a system and method of decoding LDPC code blocks. More specifically, a LDPC decoder used in a receiver apparatus can apply an accelerated belief propagation method for iteratively decoding each code block. When the number of iterations reaches a threshold value, the accelerated belief propagation method can adjust the initial condition used in the iterative method. The initial condition is adjusted so as to enhance the likelihood of convergence. As a result, performance of the decoder and receiver apparatus can be improved.

In some embodiment, a method of decoding a LDPC code block comprises initializing an initial condition and a first message, performing one or more decoding iterations, wherein each of the decoding iterations comprises: a variable node processing step that derives a second message from the initial condition and the first message, and a check node processing step that updates the first message from the second message. After each of the decoding iterations, the method comprises comparing a current count of the decoding iterations against a threshold value, adjusting the initial condition when the current count of the decoding iterations is equal to the threshold value, and repeating one or more of the decoding iterations applied on the adjusted initial condition.

The present application also describes a LDPC decoder. In some embodiments, the LDPC decoder comprises a plurality of memory buffers, a plurality of node processing units respectively associated with variable nodes and check nodes, an adjuster module, and a controller. The controller is configured to initialize an initial condition, cause the node processing units to perform one or more decoding iterations during which the initial condition is used for generating extrinsic information that is exchanged between the node processing units, compare a current count of the decoding iterations against a threshold value after each of the decoding iterations, and send an enable signal to the adjuster module for triggering adjustment of the initial condition when the current count of the decoding iterations is equal to the threshold value.

In other embodiments, the present application also describes a receiver apparatus that can comprise a tuner, a symbol de-mapping unit adapted to output a bit stream conveying code blocks, and the LDPC decoder for processing each of the code blocks.

At least one advantage of the systems and methods described herein is the ability to enhance convergence in the iterative decoding method. As a result, performance of the LDPC decoder can be improved.

DETAILED DESCRIPTION

The present application describes a system and method of decoding LDPC code blocks. More specifically, a receiver apparatus is provided with a LDPC decoder that can apply an accelerated belief propagation method for iteratively decoding each code block. When the number of iterations reaches a threshold value, the accelerated belief propagation method can adjust the initial condition used in the iterative method. The initial condition is adjusted so as to enhance the likelihood of convergence. As a result, performance of the decoder (and receiver apparatus) can be improved.

Figure 1:
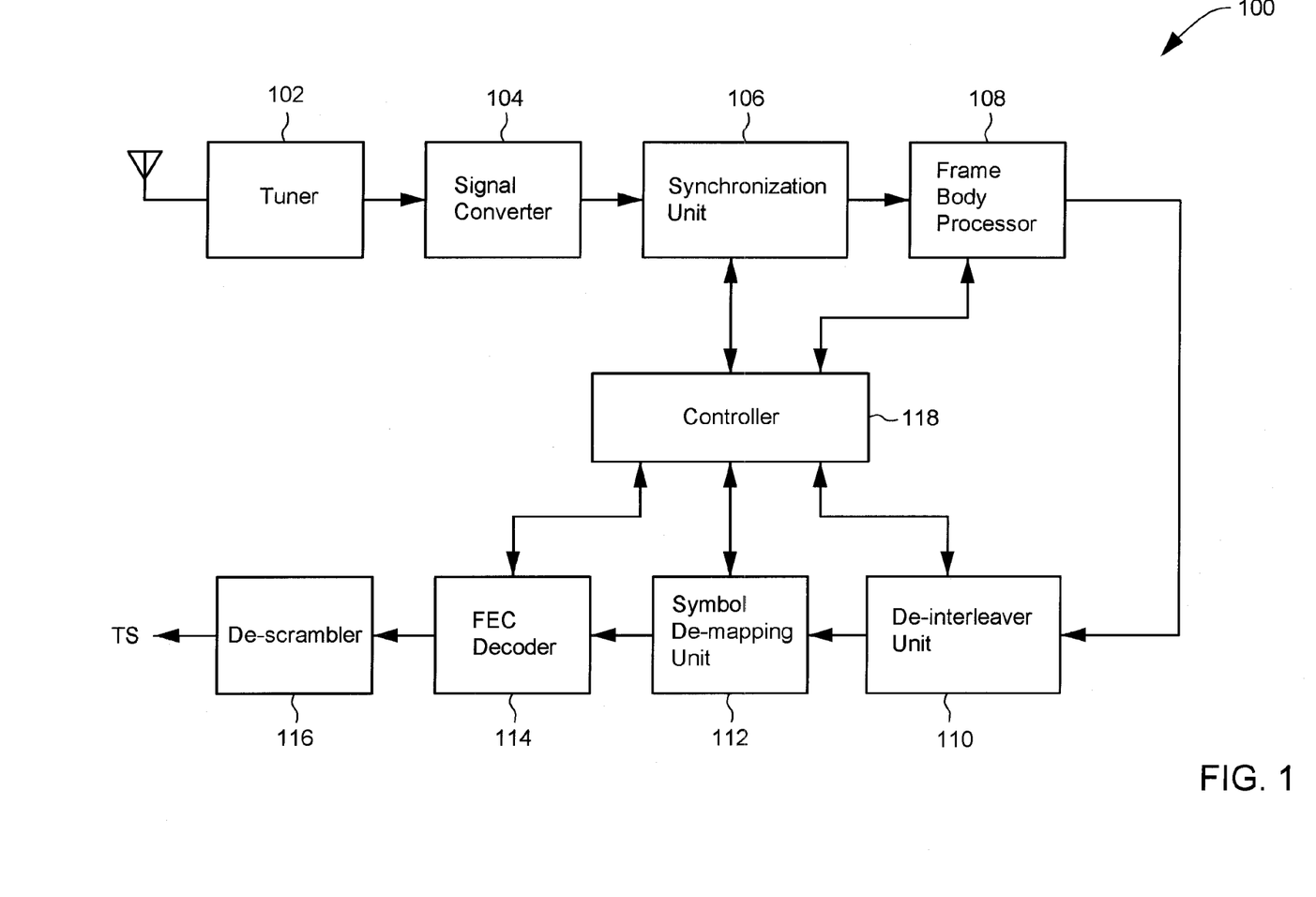
FIG. 1 is a block diagram illustrating one embodiment of a receiver apparatus.

FIG. 1 is a block diagram illustrating one embodiment of a receiver apparatus 100. The receiver apparatus 100 can include a tuner 102, a signal converter 104, a synchronization unit 106, a frame body processor 108, a de-interleaver unit 110, a symbol de-mapping unit 112, a forward error correction (FEC) decoder 114, a descrambler 116 and a controller 118.

The tuner 102 can amplify an analog RF signal received via an antenna, down-convert the RF signal to a base-band signal, and filter the base-band signal.

The signal converter 104 can adjust the gain of the received signal, and may comprise an analog-to-digital converter (ADC) for converting the received signal into a digital form. The output of the signal converter 104 can be supplied to the synchronization unit 106.

The synchronization unit 106 can be adapted to synchronize a plurality of frames from the received signal. More specifically, the synchronization unit 106 can use a PN sequence embedded in the signal outputted from the signal converter 104 for finding a head of each frame, extract system information and send it to the controller 118, and transmit a data signal conveying the frames to the frame body processor 108 in a synchronized manner.

The frame body processor 108 can convert data symbols from the received signal from the time domain to the frequency domain by applying Fast Fourier Transform (FFT) or Discrete Fourier Transform (DFT). In addition, the frame body processor 108 may comprise an equalizer that remove noise from the data symbols to compensate for channel distortion. The output of the frame body processor 108 can accordingly include a number of parallel streams in the frequency domain, which are then processed through the de-interleaver unit 110 that de-interleaves data symbols on a block basis.

The symbol de-mapping unit 112 can de-map the data symbols outputted from the de-interleaver unit 110 by using a demodulation scheme associated with the modulation scheme applied by the transmitter apparatus. The applied modulation/demoulation scheme, which can be determined from system information stored at the controller 118, may differ according to the specification of the transmission standard. For example, the modulation/demodulation scheme can include 64-quadrature amplitude modulation (64-QAM), 32-quadrature amplitude modulation (32-QAM), 16-quadrature amplitude modulation (16-QAM), 4-quadrature amplitude modulation (4-QAM), and 4-quadrature amplitude modulation Nordstrom-Robinson (4-QAM-NR), quadrature phase shift keying (QPSK), binary phase shift keying (BPSK), and the like. After the data symbols are demodulated, the symbol de-mapping unit 112 can output a bit stream conveying FEC code blocks that may be encapsulated in the form of frames.

The FEC decoder 114 can decode the FEC code blocks according to the FEC encoding method applied at the transmitter apparatus, detect and correct errors that may have been introduced during transmission, and output a stream of decoded binary digits. In one embodiment, the applied FEC code blocks can include low-density parity check (LDPC) code defined by a parity-check matrix H. Accordingly, the FEC decoder 114 can include a LDPC decoder unit adapted to decode LDPC code blocks based on the parity-check matrix H. One embodiment of the LDPC decoder unit is described hereafter with reference to FIG. 2. The stream of decoded binary digits outputted from the FEC decoder 114 can be then processed through the descrambler 116 to recover transport stream TS packets.

Figure 2:
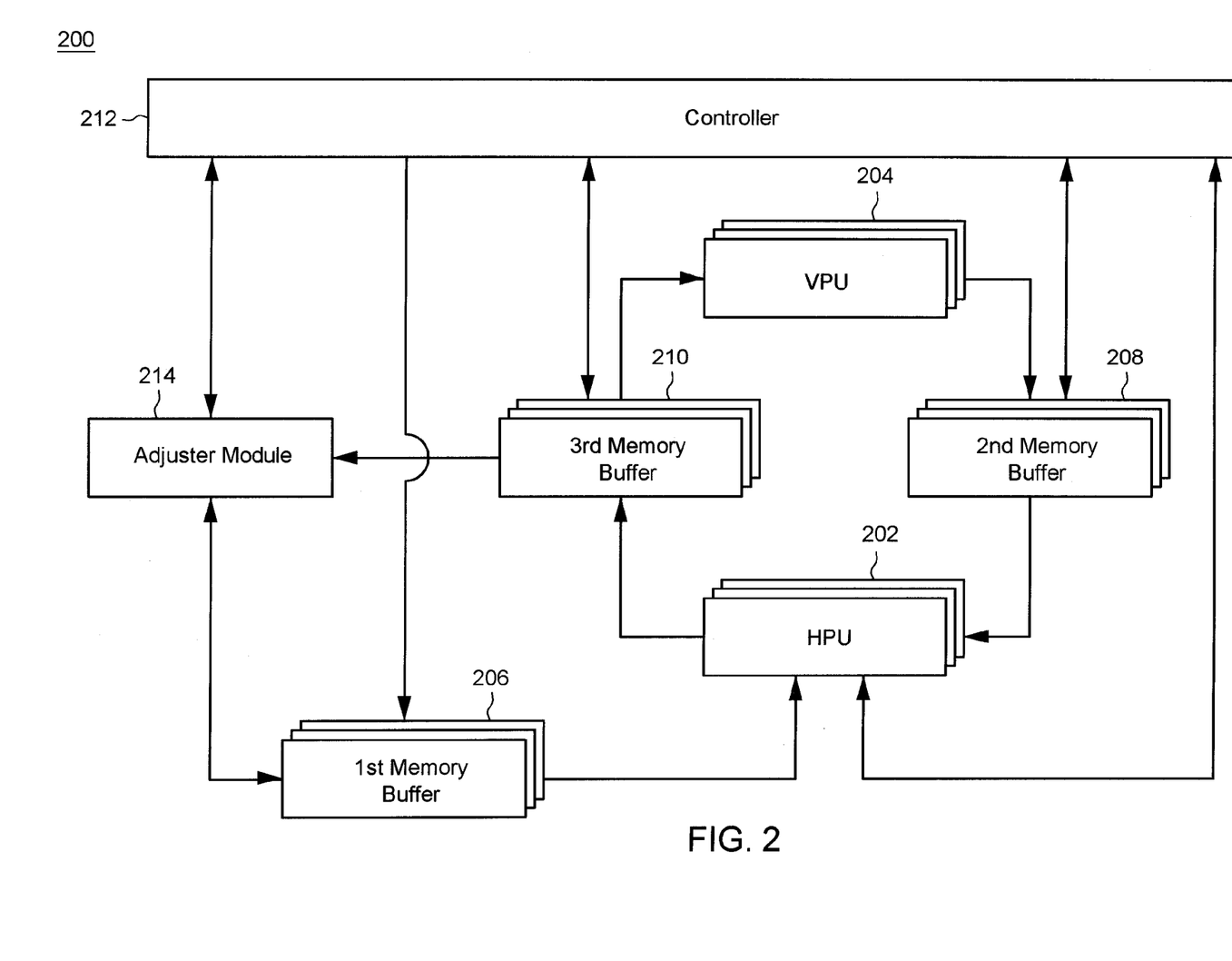
FIG. 2 is a simplified block diagram illustrating one embodiment of a LDPC decoder unit.

FIG. 2 is a simplified block diagram illustrating one embodiment of a LDPC decoder unit 200 that can be implemented in the FEC decoder 114 for decoding LDPC code blocks. The LDPC decoder unit 200 can comprise a plurality of first node processing units (HPU) 202, a plurality of second node processing units (VPU) 204, a plurality of first memory buffers 206, second memory buffers 208 and third memory buffers 210, a controller 212, and an adjuster module 214. In one embodiment, the shown LDPC decoder unit 200 is configured to implement an iterative decoding method based on a belief propagation algorithm.

The first memory buffers 206 can be used for storing an initial condition used in the iterative decoding method. The initial condition can include probability values of a received bit sequence to be decoded, e.g., log-likelihood ratio (LLR) of symbol codes outputted from the symbol de-mapping unit 112.

The first node processing units 202 can access the initial condition stored in the first memory buffers 206, compute a second message from the initial condition in the first memory buffers 206 and a first message stored in the second memory buffers 208, and stores the second message in the third memory buffers 210.

The second node processing units 204 can access the second message from the third memory buffers 210, compute an updated first message from the second messages, and store the updated first message in the second memory buffers 208. From the updated first message and initial condition, the first node processing units 202 can derive a posteriori log-likelihood ratios (LLR) information that is stored in the third memory buffers 210.

The controller 212 can timely supervise the computing operations performed by the first node processing units 202 and the second node processing units 204, and determine whether an exit condition of the iterative method has been satisfied. In addition, the controller 212 can track a count of decoding iterations, and send enable signals to the adjuster module 214 for triggering adjustment of the initial condition when a predetermined iteration threshold value is reached.

In response to the enable signal from the controller 212, the adjuster module 214 can access the initial condition stored in the first memory buffers 206, adjust the initial condition based on posteriori log-likelihood ratios (LLR) information, and store the modified initial condition into the first memory buffers 206.

Figure 3:
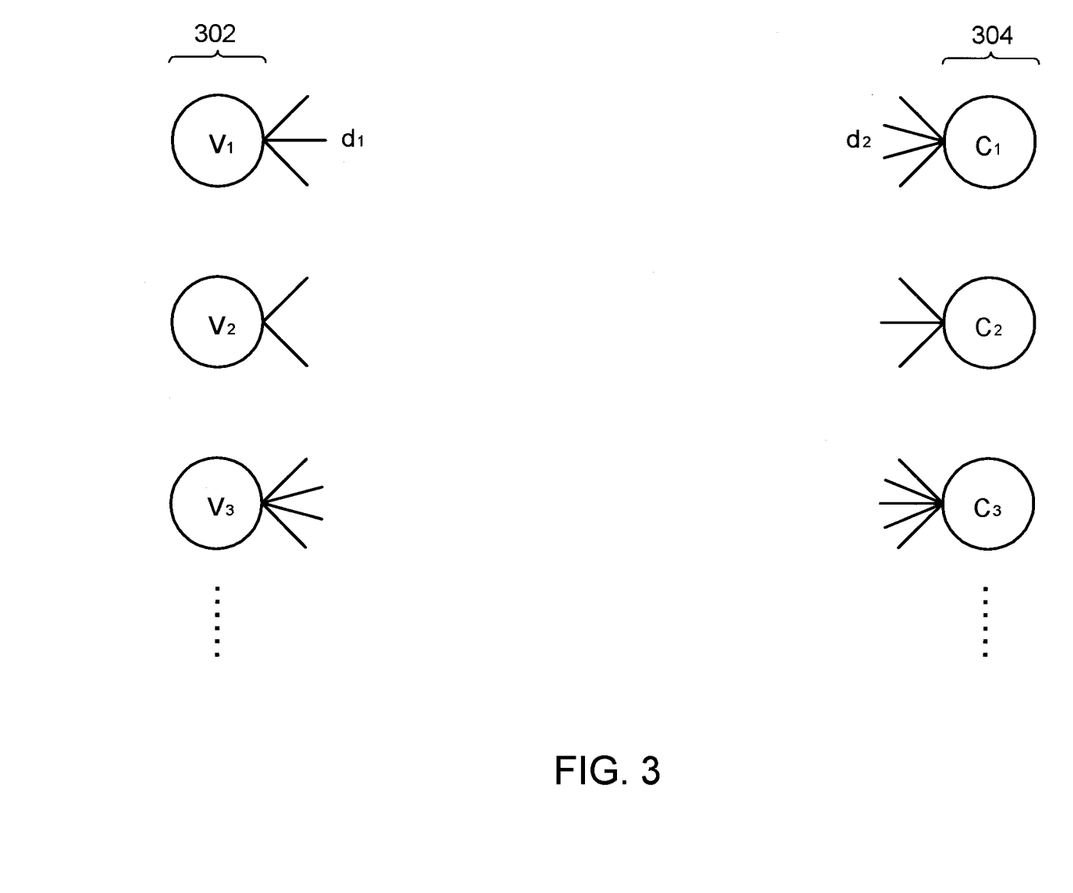
FIG. 3 is a bipartite graph representing the structure of a LDPC code.

FIG. 3 is a bipartite graph representing the structure of a LDPC code. As shown, the LDPC code can define a plurality of code nodes including variable nodes 302 (e.g., v1, v2, v3, etc.) and check nodes 304 (e.g., c1, c2, c3, etc.). Each of the variable nodes 302 may be associated with a number $d_1$ of check nodes 304, and each of the check nodes 304 can be associated with a number $d_2$ of variable nodes 302. For clarity, the connections between the variable nodes 302 and check nodes 304 are not completely drawn. In the illustrated structure, one variable node 302 is attributed to each bit in a code block, and there is one check node 304 for each parity check condition defined by the parity check matrix H (i.e., the number of check nodes 304 corresponds to the number of rows in the parity check matrix H). Based on received variable data (which may contain errors), the LDPC decoder unit 200 can apply a LDPC decoding method in which values for the variable nodes 302 can be estimated subject to parity check conditions defined by each check node 304. In the applied iterative method, one first node processing unit 202 can be associated with each variable node 302, one second node processing unit 204 can be associated with each check node 304, and extrinsic information can be computed and exchanged between the first node processing units 202 and second node processing units 204 during each iteration.

Figure 4:
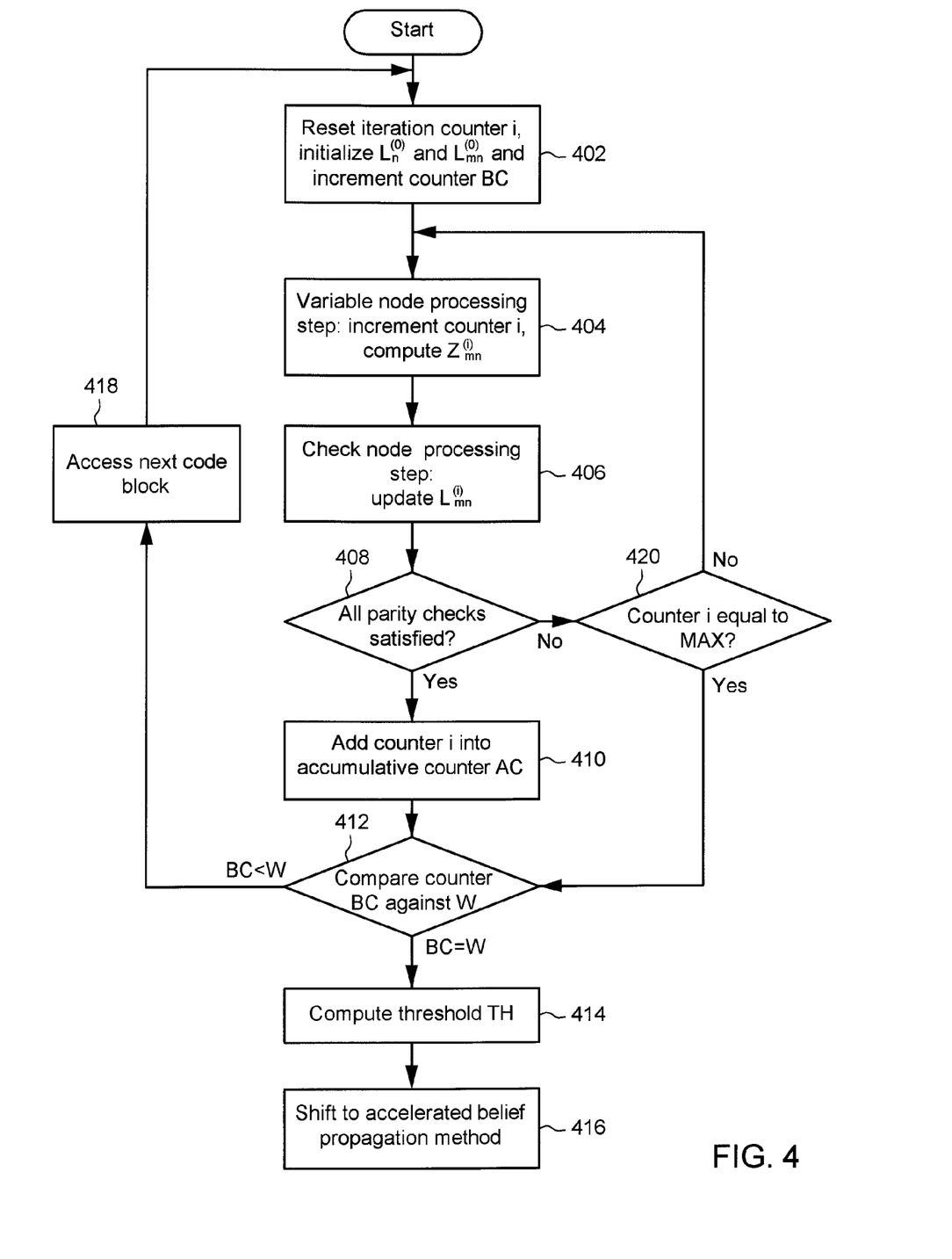
FIG. 4 is a flowchart of method steps performed by the LDPC decoder unit shown in FIG. 2 for decoding LDPC code blocks.

In conjunction with FIGS. 2 and 3, FIG. 4 is a flowchart of method steps performed by the LDPC decoder unit 200 for decoding LDPC code blocks. For clarity, the following symbols are defined:

N(m) is the set of variable nodes connected with a check node m.

M(n) is the set of check nodes connected with variable node n.

M(n)\m is the set M(n) with check node m excluded.

N(m)\n is the set N(m) with variable node n excluded.

$L_n^{(0)}$ designates an initial condition associated with the variable node n, wherein n is in the range [0, N−1], and N is the length of a code block. Hereafter, the designation $L_n^{(0)}$ can be interchangeably used to refer to the initial condition value associated with one specific variable node n, as well as the set of initial condition values associated with the entire set of variable nodes.

$L_{mn}^{(i)}$ designates a first message passed from the check node m to the variable node n at the (i-th) iteration, which can also be referred to as check-to-variable message.

$Z_{mn}^{(i)}$ designates a second message passed from the variable node n to the check node m at the (i-th) iteration, which can also be referred to as variable-to-check message.

$P_n^i$ designates a posteriori LLR information that can be computed from the initial condition $L_n^{(0)}$ and certain extrinsic information (i.e., first message $L_{mn}^{(i)}$).

The first and second messages $L_{mn}^{(i)}$ and $Z_{mn}^{(i)}$, and a posteriori LLR information $P_n^i$ form extrinsic information that are computed and exchanged between the variable nodes and check nodes at each iteration.

Referring to FIG. 4, the controller 212 in step 402 can perform an initialization step upon reception of a new code block to decode. In the initialization step, the controller 212 can reset the iteration counter i, initialize the initial condition $L_n^{(0)}$ and the first message $L_{mn}^{(0)}$ and store the initial condition $L_n^{(0)}$ and the first message $L_{mn}^{(0)}$ respectively in the first memory buffers 206 and the second memory buffers 208. The initial condition $L_n^{(0)}$ can be initialized to a priori LLRs of the code block bit sequence received from the symbol de-mapping unit, wherein n designates the respective bit positions in the code block. Moreover, the first message $L_{mn}^{(0)}$ can be initialized to zero, and a counter of processed code blocks BC initially reset to zero can be incremented by 1.

In step 404, the LDPC decoder unit 200 can perform a variable node processing step. In the variable node processing step, the iteration counter i can be incremented by 1, and the first node processing units 202 can compute the second message $Z_{mn}^{(i)}$ from the initial condition $L_n^{(0)}$ and the first message $L_{mn}^{(i-1)}$. In one embodiment, the second message $Z_{mn}^{(i)}$ can be computed according to the following expression:

$$Z_{mn}^{(i)} = L_n^{(0)} + \sum_{m' \in M(n)\backslash m} L_{m'n}^{(i-1)}. \quad (1)$$

It will be appreciated that any known equivalent mathematical formulae may also be applicable for computing the second message $Z_{mn}^{(i)}$. The obtained second message $Z_{mn}^{(i)}$ can be stored in the memory buffers 210.

In step 406, the LDPC decoder unit 200 can then perform a check node processing step. In the check node processing step, the second node processing units 204 can update the first message $L_{mn}^{(i)}$, and then store the updated first message $L_{mn}^{(i)}$ in the second memory buffers 208. In one embodiment, the updated first message $L_{mn}^{(i)}$ can be computed from the second message according to the following expression:

$$L_{mn}^{(i)} = -S(L_{mn}^{(i)}) \times M(L_{mn}^{(i)}) \quad (2),$$

wherein the symbols S and M respectively represent the sign and magnitude of the first message $L_{mn}^{(i)}$ that may be computed according to the following expressions:

$$M(L_{mn}^{(i)}) = \Phi^{-1}\left[\sum_{n' \in N(m)\backslash n} \Phi(|Z_{mn'}^{(i-1)}|)\right], \quad (3)$$

and $$S(L_{mn}^{(i)}) = \prod_{n' \in N(m)\backslash n} \text{sign}(Z_{mn'}^{(i-1)}), \quad (4)$$

wherein the function $\Phi(x)$ can be defined as:

$$\Phi(x) = -\frac{1}{2}\log\left(\tanh\left(\frac{x}{2}\right)\right). \quad (5)$$

In practice, the function $\Phi(x)$ may be approximated by a look-up table.

In step 408, the LDPC decoder unit 200 can then determine whether all the parity checks are satisfied. For this purpose, the first node processing units 202 can derive a posteriori LLR information $P_n^i$ associated with variable node n from the initial condition $L_n^{(0)}$ and the updated first message $L_{mn}^{(i)}$, and compute a vector C having components $C_n$ and a syndrome S. In one embodiment, the a posteriori LLR information $P_n^i$, vector C and syndrome S can be respectively computed according to the following expressions:

$$P_n^i = L_n^{(0)} + \sum_{m \in M(n)} L_{mn}^{(i)}; \quad (6)$$

$C_n=1$ if a posteriori LLR information $P_n>0$, else $C_n=0$ (7), and $S=CH^T$ (8), wherein $H^T$ is the transpose of the parity check matrix H.

When there is convergence, the syndrome S is equal to 0, meaning that all of the parity checks are satisfied.

In case all the parity checks are verified, the first node processing units 202 can accordingly notify the controller 212. The controller 212 in step 410 can then add the current iteration counter i into an accumulative counter AC indicative of the accumulated amount of iterations with successful convergence. In step 412, the controller 212 can then compare the counter of processed code blocks BC against a predetermined value representative of a test window W. If the counter of processed code blocks BC is equal to the test window W, the controller 212 in step 414 can compute a threshold value TH obtained by dividing the accumulative counter AC by the counter of processed code blocks BC. Accordingly, the threshold value TH is a statistically computed quantity that can represent an average amount of iterations required for successful convergence. In following step 416, the LDPC decoder unit 200 can then shift to an accelerated belief propagation method that takes into account the threshold value TH. Detailed description of the accelerated belief propagation method is described hereafter with reference to FIG. 5.

Referring again to FIG. 4, if the counter of processed code blocks BC is less than the test window W, the controller 212 in step 418 can access a next code block, and the aforementioned process can be then repeated for the next code block.

When the parity checks are not satisfied in step 408, the controller 212 in step 420 can compare the current iteration counter i against a predetermined maximum iteration value MAX. If the current iteration counter i has not reached the maximum iteration value MAX, steps 404 through 408 can be repeated to apply a next iteration. In contrast, if the current iteration counter i has reached the maximum iteration value MAX, the controller 212 can skip step 410 as no convergence result is reached, and can directly branch to step 412 to determine whether the test window W is completed. Depending on whether the counter of processed code blocks BC is smaller than or equal to the test window value W, the LDPC decoder unit 200 can apply either the belief propagation algorithm for a next code block, or steps 414 and 416 to compute the threshold value TH and shift to the accelerated belief propagation method.

For accurately determining the average number of iterations for convergence, the aforementioned embodiment defines the time period of the test window W during which the threshold value TH can be statistically derived. However, it is appreciated that alternate embodiments may also provide a threshold value which is pre-programmed, such that no test window is required. In this case, the accelerated belief propagation method can be directly performed as detailed hereafter.

In conjunction with FIGS. 2 through 4, FIG. 5 is a flowchart illustrating method steps of the accelerated belief propagation method performed by the LDPC decoder unit 200. In step 502, the controller 212 can reset the iteration counter i, initialize the initial condition $L_n^{(0)}$ and the first message $L_{mn}^{(0)}$, and respectively store the initial condition $L_n^{(0)}$ and the first message $L_{mn}^{(0)}$ in the first memory buffers 206 and the second memory buffers 208. The initial condition $L_n^{(0)}$ associated with the bit position n can be initialized to a priori LLRs of the received bit sequence (i.e., bit stream). The first message $L_{mn}^{(0)}$ can be initialized to zero.

Figure 5:
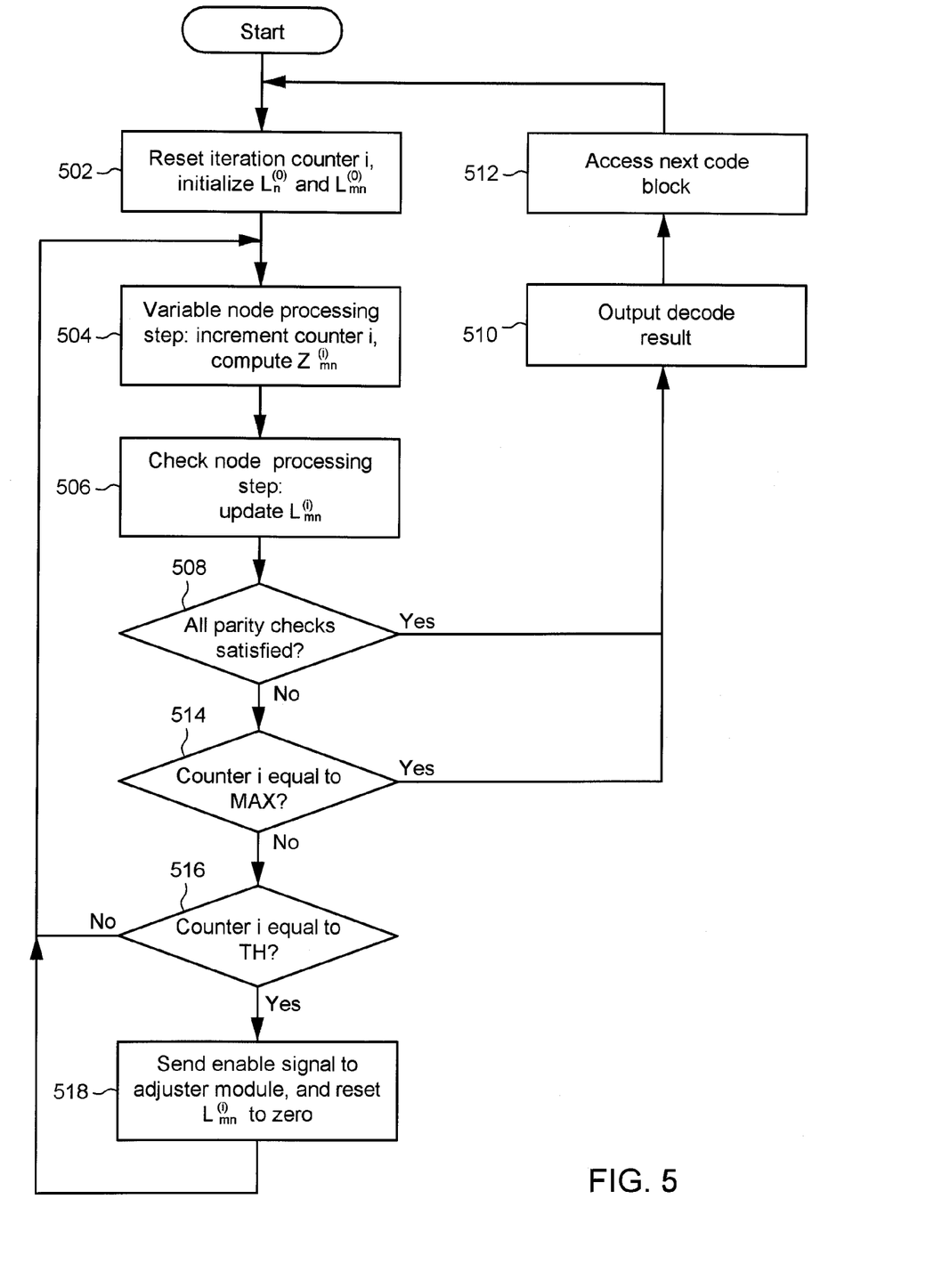
FIG. 5 is a flowchart illustrating method steps of an accelerated belief propagation method performed by the LDPC decoder unit.

In step 504, the LDPC decoder unit 200 can perform a variable node processing step. In the variable node processing step, the iteration counter i can be incremented by 1, and the first node processing units 202 can compute the second message $Z_{mn}^{(i)}$ from the initial condition $L_n^{(0)}$ and the first message $L_{mn}^{(i-1)}$. In one embodiment, the second message $Z_{mn}^{(i)}$ can be computed according to the aforementioned equation (1) or other adequate expressions. The obtained second message $Z_{mn}^{(i)}$ can be then stored in the third memory buffers 210.

In step 506, the LDPC decoder unit 200 can then perform a check node processing step. In the check node processing step, the second node processing units 204 can update the first message $L_{mn}^{(i)}$ from the second message $Z_{mn}^{(i)}$, and then store the updated first message $L_{mn}^{(i)}$, in the second memory buffers 208. The updated first message $L_{mn}^{(i)}$, can be computed according to the aforementioned equations (2)~(5) or other equivalent expressions.

In step 508, the LDPC decoder unit 200 can then determine whether all parity checks are satisfied. For this purpose, the first node processing units 202 can derive the a posteriori LLR information $P_n^i$ from the initial condition $L_n^{(0)}$ and the updated first message $L_{mn}^{(i)}$, and compute the vector C having components $C_n$ and a syndrome S as defined previously in expressions (6)~(8). Likewise, all of the parity checks are satisfied when the syndrome S is equal to 0.

In step 510, in case all the parity checks are verified, the controller 212 can output the correctly decoded data for subsequent processing. In following step 512, a next code block can then be accessed, and the process can be repeated for the next code block.

When the parity checks are not satisfied, the controller 212 in step 514 can compare the current iteration counter i against a predetermined maximum iteration value MAX. In case the current iteration counter i has reached the maximum iteration value MAX, step 510 can be performed to output a decode result without successful convergence. The LDPC decoder unit 200 can then perform step 512 to access a next code block, and steps 502 through 508 can be repeated for decoding the next code block.

If the current iteration counter compared in step 514 i is not equal to (i.e., smaller than) the maximum iteration value MAX, the controller 212 can perform step 516 to further compare the current iteration counter i against the threshold value TH. In case the current iteration counter i differs from the threshold value TH (i.e., smaller than the threshold value TH), steps 504 through 508 can be repeated for applying a next iteration. In case the current iteration counter i is equal to the threshold value TH, the controller 212 in step 518 can reset the first message $L_{mn}^{(i)}$ to zero, and issue an enable signal to the adjuster module 214 to trigger adjustment of the initial condition $L_n^{(0)}$. After step 518 is completed, steps 504 through 508 can be repeatedly applied based on the adjusted initial condition $L_n^{(0)}$.

Figure 6:
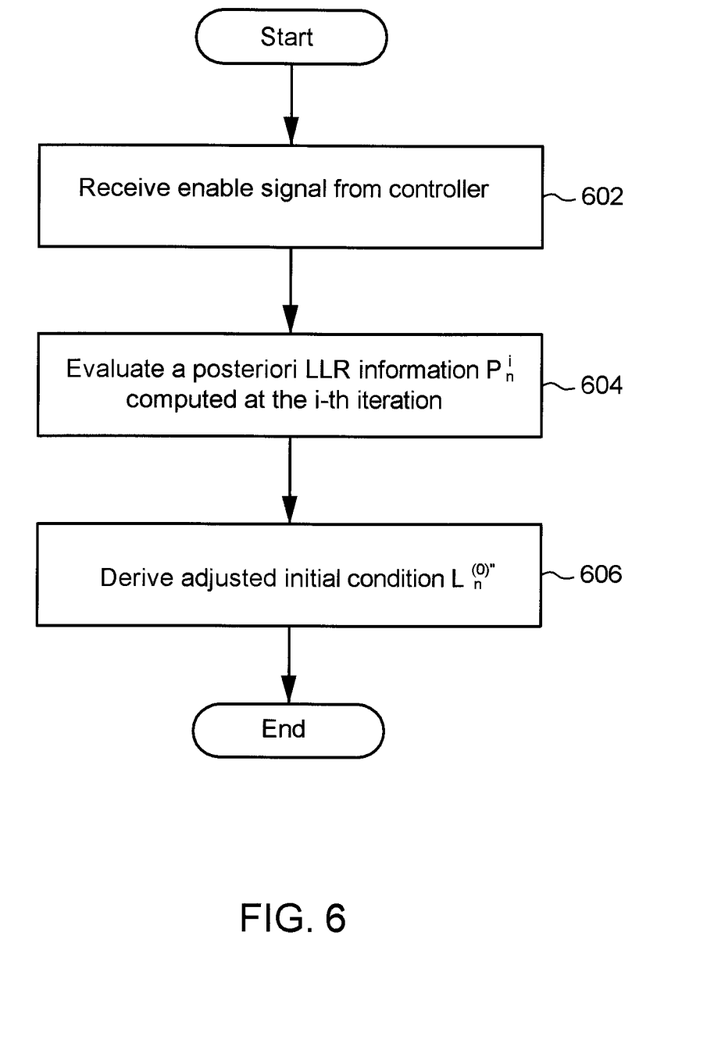
FIG. 6 is a flowchart of method steps performed by an adjuster module included in the LDPC decoder unit.
Figure 7:
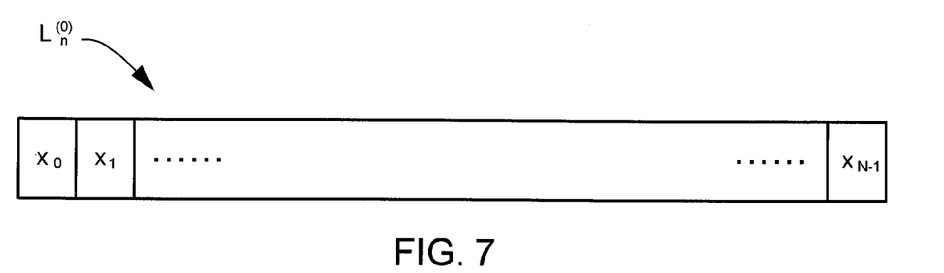
FIG. 7 is a simplified diagram illustrating an initial condition $L_n^{(0)}$.
Figure 8:
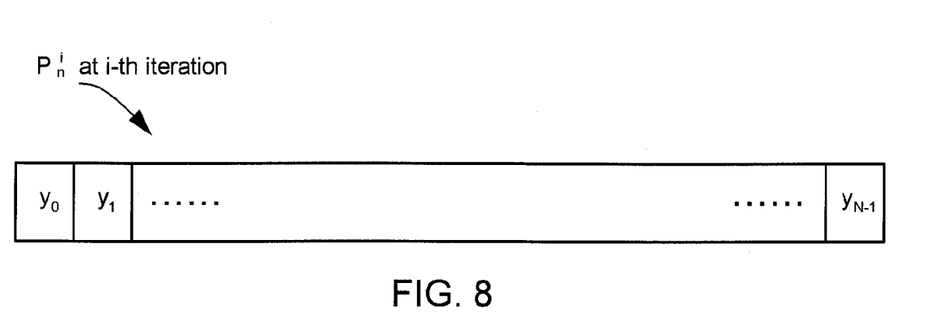
FIG. 8 is a simplified diagram illustrating a posteriori LLR information $P_n^i$ at the i-th iteration.
Figure 9:
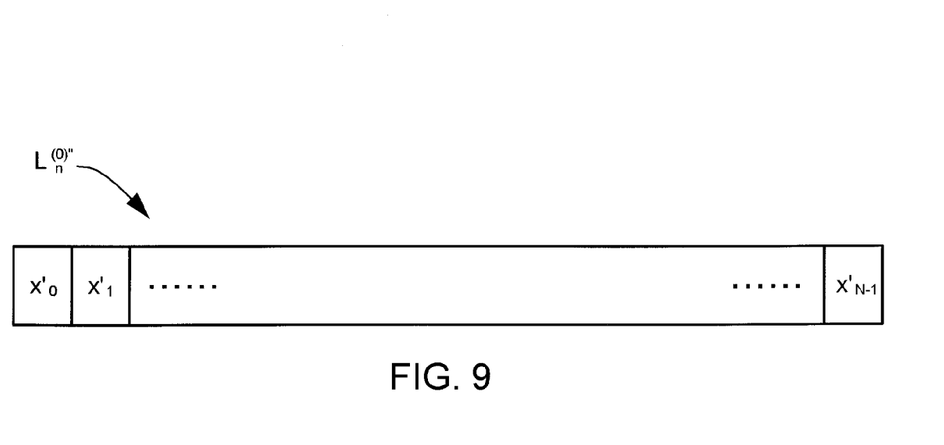
FIG. 9 is a simplified diagram illustrating an adjusted initial condition $L_n^{(0)''}$.

FIG. 6 is a flowchart of method steps performed by the adjuster module 214. In initial step 602, the adjuster module 214 can receive an enable signal from the controller 212. Accordingly, in step 604, the adjuster module 214 can evaluate the a posteriori LLR information $P_n^i$ computed at the i-th iteration (i.e., equal to the threshold value TH). In step 606, the adjuster module 214 can then derive an adjusted initial condition $L_n^{(0)'''}$, for example based on the a posteriori LLR information $P_n^i$. Suppose that the initial condition $L_n^{(0)}$ including components $x_n$ can be represented by the bit sequence shown in FIG. 7, the a posteriori LLR information $P_n^i$ including components $y_n$ at the i-th iteration can be represented by the bit sequence shown in FIG. 8, and the adjusted initial condition $L_n^{(0)'''}$ including components $x'_n$ can be represented by the bit sequence shown in FIG. 9. The adjusted initial conditions $L_n^{(0)'''}$ can be derived according to different methods as detailed hereafter.

According to a first embodiment, step 606 can convert the initial condition $L_n^{(0)}$ into the adjusted initial condition $L_n^{(0)'''}$ according to the following method:

$$x'_n = +|x_n| \text{ if } y_n \geq 0, \text{ and } x'_n = -|x_n| \text{ if } y_n < 0 \quad (9).$$

In other words, each component $x'_n$ of the adjusted initial condition $L_n^{(0)'''}$ has an absolute value that is equal to that of $x_n$ and is assigned with the sign of the component $y_n$ of the a posteriori LLR information $P_n^i$.

According to a second embodiment, step 606 can derive the adjusted initial condition $L_n^{(0)'''}$ by determining whether the components $x_n$ of the initial condition $L_n^{(0)}$ and the corresponding components $y_n$ of the a posteriori LLR information $P_n^i$ have different signs. For each pair of components $x_n$ and $y_n$ that have different signs, the component $x'_n$ of the adjusted initial condition $L_n^{(0)'''}$ can be assigned with an absolute value that is smaller than the absolute value of $x_n$, and keep the sign of the component $x_n$. In case the components $x_n$ and $y_n$ have the same signs, the component $x'_n$ of the adjusted initial condition $L_n^{(0)'''}$ can be equal to the component $x_n$ of the initial condition $L_n^{(0)}$. Accordingly, the adjusted initial condition $L_n^{(0)'''}$ can be defined as follows:

If $\text{sign}(x_n) \neq \text{sign}(y_n)$, $x'_n = \text{sign}(x_n) \times |x'_n|$, wherein $|x'_n| < |x_n|$        (10);

and

If $\text{sign}(x_n) = \text{sign}(y_n)$, $x'_n = x_n$        (11).

In some embodiments, the absolute value $|x'_n|$ defined in (10) may be assigned with the smallest permissible value, e.g., $|x'_n|$ may be equal to 0.01 when $|x_n|$ is equal to 0.09.

According to a third embodiment, step 606 can adjust the initial condition $L_n^{(0)}$ into the adjusted initial condition $L_n^{(0)'''}$ by applying the following expression:

$$x'_n = f_0 \cdot x_n + f_1 \cdot y_n \quad (12),$$

wherein $f_0$ and $f_1$ are predetermined constant factors.

Regardless of the method employed, the adjustment of the initial condition $L_n^{(0)}$ can be regarded as an attempt to correct the a priori LLR based on the a posteriori LLR information $P_n^i$. This adjustment can enhance convergence in the iterative decoding method. Experimental simulation shows that the decoding algorithm can converge efficiently through a few number of additional iterations after adjustment of the initial condition $L_n^{(0)}$, while there may be no convergence at all without adjustment. Accordingly, performance of the LDPC decoder unit can be improved.

Realizations in accordance with the present invention have been described in the context of particular embodiments. These embodiments are meant to be illustrative and not limiting. Many variations, modifications, additions, and improvements are possible. Accordingly, plural instances may be provided for components described herein as a single instance. Structures and functionality presented as discrete components in the exemplary configurations may be implemented as a combined structure or component. These and other variations, modifications, additions, and improvements may fall within the scope of the invention as defined in the claims that follow.

What is claimed is:

1. A method of decoding a LDPC code block, comprising:
   initializing an initial condition and a first message;
   performing one or more decoding iterations, wherein each of the decoding iterations comprises:
      a variable node processing step that derives a second message from the initial condition and the first message; and
      a check node processing step that updates the first message from the second message;
   after each of the decoding iterations, comparing a current count of the decoding iterations against a threshold value;
   when the current count of the decoding iterations is equal to the threshold value, adjusting the initial condition, resetting the first message to zero, and repeating one or more of the decoding iterations applied on the adjusted initial condition.

2. The method according to claim 1, wherein the step of initializing the initial condition comprises:
   initializing the initial condition to log-likelihood ratios of a received bit sequence.

3. The method according to claim 2, wherein each of the decoding iterations further comprises:
   after the first message is updated in the check node processing step, deriving a posteriori log-likelihood ratio information from the initial condition and the first message.

4. The method according to claim 3, wherein the step of adjusting the initial condition comprises:
   evaluating a sign contained in the a posteriori log-likelihood ratio information.

5. The method according to claim 4, wherein the adjusted initial condition has an absolute value that is equal to that of the initial condition and is assigned with the sign of the a posteriori log-likelihood ratio information.

6. The method according to claim 4, wherein the step of adjusting the initial condition comprises:
   comparing a sign of the initial condition against the sign of the a posteriori log-likelihood ratio information; and
   when the initial condition and the a posteriori log-likelihood ratio information have different signs, assigning an absolute value to the adjusted initial condition that is smaller than the absolute value of the initial condition, and assigning the sign of the initial condition to the adjusted initial condition.

7. The method according to claim 4, wherein the adjusted initial condition is equal to a sum of a first product between a first factor and the initial condition with a second product between a second factor and the a posteriori log-likelihood ratio information.

8. The method according to claim 1, wherein the threshold value represents a statistically tracked average amount of the decoding iterations required for successful convergence.

9. A LDPC decoder comprising:
   a plurality of memory buffers;
   a plurality of node processing units respectively associated with variable nodes and check nodes;
   an adjuster module; and
   a controller configured to:
      initialize an initial condition;
      cause the node processing units to perform one or more decoding iterations during which the initial condition is used for generating extrinsic information that is exchanged between the node processing units, wherein each of the decoding iterations comprises:
         a variable node processing step that derives a second message from the initial condition and a first message;
         a check node processing step that updates the first message from the second message; and
         after the first message is updated in the check node processing step, deriving a posteriori log-likelihood ratio information from the initial condition and the first message;
      after each of the decoding iterations, compare a current count of the decoding iterations against a threshold value; and
      when the current count of the decoding iterations is equal to the threshold value, send an enable signal to the adjuster module for triggering adjustment of the initial condition; and
   wherein the adjuster module is adapted to evaluate a sign contained in the a posteriori log-likelihood ratio information.

10. The LDPC decoder according to claim 9, wherein the first message is reset to zero when the current count of the decoding iterations is equal to the threshold value.

11. The LDPC decoder according to claim 9, wherein the adjuster module is adapted to derive the adjusted initial condition that has an absolute value equal to that of the initial condition and is assigned with the sign of the a posteriori log-likelihood ratio information.

12. The LDPC decoder according to claim 9, wherein the adjuster module is adapted to
- compare a sign of the initial condition against the sign of the a posteriori log-likelihood ratio information; and
- when the initial condition and the a posteriori log-likelihood ratio information have different signs, assign an absolute value to the adjusted initial condition that is smaller than the absolute value of the initial condition, and assign the sign of the initial condition to the adjusted initial condition.

13. The LDPC decoder according to claim 9, wherein the adjuster module is adapted to derive the adjusted initial condition as being equal to the sum of a first product between a first factor and the initial condition with a second product between a second factor and the a posteriori log-likelihood ratio information.

14. The LDPC decoder according to claim 9, wherein the threshold value represents a statistically tracked average amount of the decoding iterations required for successful convergence.

15. The LDPC decoder according to claim 9, wherein the initial condition is initialized to log-likelihood ratios of a received bit sequence.

16. A receiver apparatus comprising:
- a tuner;
- a symbol de-mapping unit adapted to output a bit stream conveying code blocks; and
- the LDPC decoder according to claim 9 for processing each of the code blocks.

* * * * *